United States Patent [19]
Butler

[11] Patent Number: 4,687,984
[45] Date of Patent: Aug. 18, 1987

[54] JFET ACTIVE LOAD INPUT STAGE
[75] Inventor: James R. Butler, San Jose, Calif.
[73] Assignee: Precision Monolithics, Inc., Santa Clara, Calif.
[21] Appl. No.: 615,996
[22] Filed: May 31, 1984
[51] Int. Cl.[4] .............................................. H03F 3/68
[52] U.S. Cl. ..................................... 323/315; 330/258
[58] Field of Search ............... 323/314, 315, 316, 312; 330/257, 258, 288

[56] References Cited
U.S. PATENT DOCUMENTS 3,851,270 11/1974 Vosteen ................................. 330/30
4,121,169 10/1978 Iwamatsu ............................ 330/296
4,553,107 11/1985 Ogawa ................................. 330/288

Primary Examiner—Clifford C. Shaw
Attorney, Agent, or Firm—Koppel & Harris

[57] ABSTRACT

An active load circuit for operational amplifiers and the like is described which provides an improved common mode rejection ratio and common mode voltage range, and alleviates transistor saturation and cut off problems during maximum slew rates. Drive currents from the operational amplifier or other circuit are transmitted directly through respective load resistors, thereby reducing voltage offsets which degrade common mode rejection ratio. At the same time the absolute voltage levels at the operational amplifier or like circuit are reduced, thereby increasing the common mode voltage range. A pair of active load transistors are supplied with current from current sources independent of the amplifier transistors, and deliver their respective currents to the same resistors which receive the amplifier currents. An output is taken from one of the load transistors without connecting to either of the amplifier transistors.

14 Claims, 4 Drawing Figures

JFET ACTIVE LOAD INPUT STAGE

BACKGROUND OF THE INVENTION

1. Field of the Invention

This invention relates to electronic circuitry, and more particularly to active load circuits for operational amplifiers and the like.

2. Description of the Prior Art

Active load circuits have done much to improve the performance and simplify the design of modern linear circuits, especially operational amplifiers and also comparators. An active load, which is essentially a current source substituted for or supplementing a common resistor load, has several distinct advantages. First, it permits low current operation without large resistance values. This is important both in raising impedance levels and in reducing power consumption. Second, it operates over a much wider range of voltages, giving high gain with small voltage drops as well as large linear voltage swings. Also, it makes possible much higher gain per stage, so fewer stages can be used.

Although offering advantages over simple resistor loads, there are still some significant limitations associated with active load circuits when used in the input stage of an operational amplifier and other circuits. For example, an ideal operational amplifier can be considered to be a pure differential amplifier which is insensitive to a common input signal at both input terminals, the situation when the same signal is applied to both differential inputs being referred to as the "common mode". Ideally, there should be no output signal when a common mode input signal is applied. The common mode rejection ratio (CMRR) is a measure of how closely the amplifier approaches the ideal, a CMRR of 100% corresponding to ideal operation. Any variations from a total non-response to a common mode input is reflected in a lower CMRR. Such non-ideal characteristics are a measure of the quality of the components from which the amplifier is manufactured, and the intrinsic balance of the circuit. It would be desirable to increase the CMRR of present active load operational amplifiers.

Present operational amplifiers employing active loads also exhibit a limited common mode voltage range (CMVR), which is the range of input voltages over which the required performance specifications of the amplifier are satisfied. Another problem is that present circuits are also subject to being saturated or cut off during maximum slew rates ("slew rate" being defined as the ratio of change in output voltage to the minimum time required to effect this change under large-signal drive conditions).

SUMMARY OF THE INVENTION

In view of the above problems associated with the prior art, it is an object of this invention to provide an active load circuit for the input stage of an operational amplifier or like circuit which provides an improved CMRR.

Another object is the provision of an active load circuit in which CMVR is improved.

A further object is the provision of an active load circuit which is less likely than presently available circuits to go into saturation or be cut off during high slew rates.

In the accomplishment of these and other objects of the invention, an active load circuit is provided for the input stage of an operational amplifier or other circuit having a pair of variable current drives which vary in opposition to each other. The active load circuit includes first and second resistors connected to receive current from the two current drives, respectively, and a pair of current sources connected to transmit current through a pair of bipolar transistors to the resistors. The transistors are connected such that the absolute values of their base bias voltages vary with the total current through their respective resistors, while a bias circuit maintains the common mode base bias on the transistors at a level such that the currents transmitted to the resistors establish substantially equal voltage drops across the resistors. An output terminal is connected between one of the current sources and its associated transistor, and provides an output signal which varies in accordance with relative imbalances in the drive currents.

In the preferred embodiment, the bases of the two transistors are maintained at a common bias level and the two current sources are equal, as are the two resistors. The two transistors are preferably npn type with their emitters connected respectively to the two resistors, such that the transistor base bias voltage is determined by the currents through the resistors and the transistor base-emitter voltages. The current drives from the operational amplifier or other loaded circuit are connected directly to the resistors, without passing through the transistors, thus adding a voltage balance to the active load to improve the CMVR, and reducing the voltage levels at the current drive inputs to the load circuit to improve the CMRR.

These and other objects and features of the invention will be apparent to those skilled in the art from the following detailed description of the preferred embodiments, taken together with the accompanying drawings, in which:

DETAILED DESCRIPTION OF PREFERRED EMBODIMENTS

Figures 1, 2:
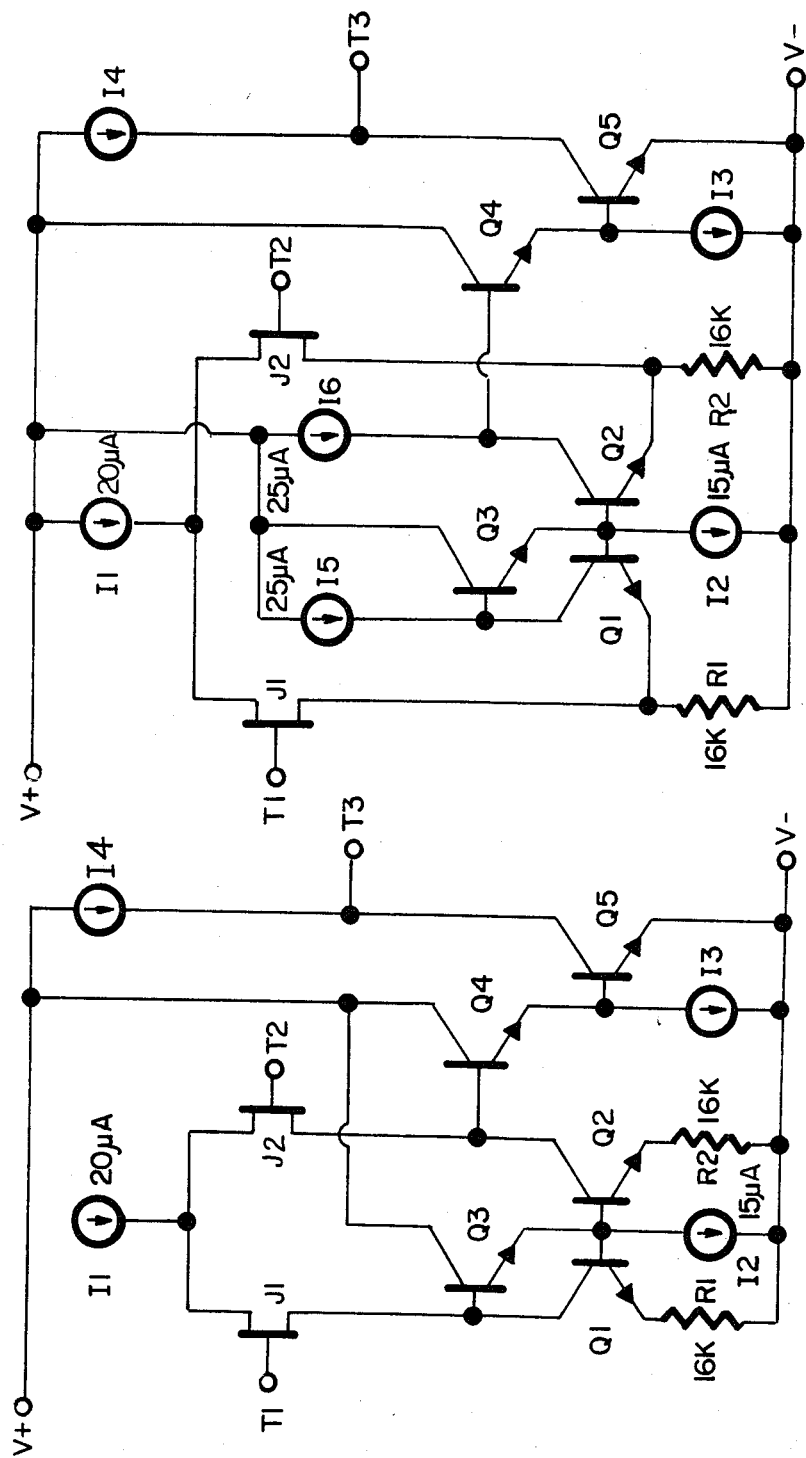
FIG. 1 is a schematic diagram of the input stage of an operational amplifier employing an active load.
FIG. 2 is a schematic diagram of the operational amplifier input stage of FIG. 1, with an active load employing the present invention.

FIG. 1 illustrates the input stage of an operational amplifier which employs a conventional type of active load popular in the industry. The amplifier has a pair of differentially connected junction field effect transistors (JFETs) J1 and J2. The sources of the JFETs are connected together and receive current from a current source I1, supplied by a positive voltage bus, while their drains provide drive currents to an active load circuit. The gates of J1 and J2 are connected to input terminals T1 and T2, respectively, and are adapted to receive differential input signals. In the manner characteristic of differential amplifiers, J1 and J2 divide the current from I1 in mutual opposition, the amount of current through each JFET varying in proportion to the relative input voltage signals applied to their gates. If a constant, known bias is applied to one of the JFET gates, the magnitude of the signal at the gate of the other JFET can be determined by the amount of current flowing through that JFET. Bipolar transistors could also be used in the amplifier, but JFETs have been found to be desirable in many applications because of their lower input bias current, higher slew rate, and greater band width. However, the novel active load of the present invention is equally applicable to operational amplifiers and similar circuits using either bipolar transistors or JFETs.

The active load for the amplifier stage consists of a pair of bipolar transistors Q1 and Q2 having their collector-emitter circuits connected to receive current from J1 and J2, respectively, and a pair of resistors R1 and R2 respectively connected between the emitters of Q1 and Q2 and a negative voltage bus.

The bases of Q1 and Q2 are connected together for common biasing. A bias circuit is provided for these transistors consisting of (1) another bipolar transistor Q3 having its collector connected to the positive voltage bus, its emitter connected to the bases of Q1 and Q2, and its base connected to the junction between the drain of J1 and the collector of Q1, and (2) a current source I2 drawing current from the common base junction to the negative voltage bus. The output of the stage is taken from the collector of Q2, which is connected to the base of an output transistor Q4. The collector of Q4 is connected to the positive voltage bus, while its emitter is connected to the base of another output transistor Q5 and also to another current source I3, the latter current source drawing current from Q4 to the negative voltage bus. The collector of Q5 receives current from current source I4, the other side of which is connected to the positive voltage bus, while its emitter is connected to the negative voltage bus. A final output terminal T3 is connected to the junction between the collector of Q5 and I4.

In operation, the current from I1 is steered between J1 and J2 in accordance with the bias voltages applied to T1 and T2; a greater voltage at T2 will result in a correspondingly greater current through J1. This will tend to increase the current through Q2 relative to that through Q1. Thus, Q2 will transmit a current greater than I6. This change in current in Q2 results in a change in voltage at the collector of Q2 and the base of Q4. This change in voltage is transmitted to the base of Q5, resulting in an increase in voltage at T3. A negative feedback circuit (not shown) connects T3 back to the inputs of J1 and J2, and tends to balance those devices so as to reduce the imbalance at the base of Q4. The net result is that the voltage swing at the base of Q4 and at T3 is mitigated, but still reflects the differential between the J1/J2 gate voltages.

If the voltage at the gate of J1 is now made greater, rather than less than the J2 gate voltage, a corresponding increase in current in J2 relative to that in J1 will result. This will tend to reduce the current in Q2 relative to I6, thus an increase in voltage at the collector of Q2 and the base of Q4. This change in voltage at the base of Q4 is transmitted to the base of Q5 resulting in a decrease in the voltage at T3.

The CMRR of the FIG. 1 circuit is limited because the drain voltages of J1 and J2 are generally unbalanced; equal drain voltages would result in a much higher CMRR. The drain voltages of J1 and J2 are unbalanced because they are established independently of each other. The J1 drain voltage is equal to the sum of (1) the voltage drop across R1, plus (2) the base-emitter voltage (Vbe) of Q1, plus (3) Vbe of Q3. The drain voltage of J2, on the other hand, is established at the sum of (1) Vbe of Q5, plus (2) Vbe of Q4. Because of this independent establishment of drain voltages, it is possible for those voltages to be quite unbalanced when common mode, equal input signals are applied to the gates of J1 and J2.

The FIG. 1 circuit also has a limited CMVR. The CMVR of a JFET amplifier is limited by the requirement that the JFET operate in the saturation mode. To meet this requirement, the gate-to-drain voltage of the JFET must be equal to or greater than its pinch-off voltage. For a given gate voltage, CMVR decreases directly with any increase in the drain voltage. With the FIG. 1 circuitry, the drain voltages of J1 and J2 will at all times be at least 2 Vbe, or approximately 1.4 volts. The operation of the circuitry is also limited in that during maximum slew rates, it is possible to saturate the active load or drive it into a cut-off state.

These problems are substantially alleviated by the active load circuit of the present invention, one embodiment of which is shown in FIG. 2. In this figure, elements which correspond to the elements of FIG. 1 are identified by the same reference numerals. The basic difference between the improved circuit and the prior art circuit of FIG. 1 is that in FIG. 1 J1 and J2 serve a dual purpose: they function together as a differential amplifier, and they also serve as current sources to supply necessary current to active load transistors Q1 and Q2. In the improved circuit of FIG. 2, on the other hand, the current source function of J1 and J2 is eliminated, and the necessary current for Q1 and Q2 is supplied by a separate current source circuit which functions independently of J1 and J2. The result of this change is to reduce the voltage offset between the drains of J1 and J2 and thereby improve CMRR, lower the drain voltage levels of J1 and J2 and thereby improve CMVR, and improve operation during high slew rates.

These features are accomplished by providing an additional pair of current sources I5 and I6 which supply current from the positive voltage bus to the collectors of Q1 and Q2, respectively. The drains of J1 and J2 are now connected directly to R1 and R2, respectively, without going through Q1 and Q2. The emitters of Q1 and Q2 are still connected to R1 and R2, respectively, but these transistors now supply current to R1 and R2 from current sources I5 and I6, rather than from J1 and J2. Q3 is still biased by the collector of Q1, but that node is now disconnected from the drain of J1. Similarly, the base of output transistor Q4 is still biased by the collector of Q2, but that node is disconnected from the drain of J2. In other respects the circuits of FIGS. 1 and 2 are essentially the same.

In the common mode, with J1 and J2 equally biased and carrying equal currents, the voltages developed at the drains of J1 and J2 will be substantially equal, thereby greatly improving CMRR as compared with the prior art FIG. 1 circuit This is because R1 and R2 have equal resistance values and carry equal currents. The current through R1, ignoring the second order effects of transistor base currents, will be equal to the current through J1 (10 microamps at common mode with I1 equal to 20 microamps) plus the collector-emitter current of Q1 (25 microamps for I1 equal to 25 microamps), for a total of 35 microamps. The current through R2 will be equal to the currents through J2 and Q2, which again will total 35 microamps for the preceding assumptions with I6 equal to 25 microamps. Voltage balance is thereby maintained at the FET drains.

The CMVR of FIG. 2 is also considerably improved compared to the prior art circuitry of FIG. 1. With R1 and R2 each having a resistance value of 16 kilohm and each carrying 35 microamps at common mode, the voltage developed across both R1 and R2 will be about 0.56 volts. This is considerably less than the 1.4 volts developed across R1 and R2 in the FIG. 1 circuit, and increases CMVR by approximately 0.84 volts. The active load circuit of FIG. 2 has also been found to be less likely to become saturated or cut off during maximum slew rates.

While the circuitry of FIG. 2 is balanced with equal resistance values for R1 and R2, equal current levels for current sources I5 and I6, and transistors Q1 and Q2 being matched and commonly biased, the circuit could be unbalanced and still retain the advantages of the FIG. 2 circuit. For example, R1 and R2 could be assigned different resistance values, with I5 and I6 also made unequal but providing appropriate currents to establish substantially equal common mode voltage drops across R1 and R2. Separate bias circuits for Q1 and Q2 could also be provided, and the bipolar transistors themselves could be made pnp rather than npn as shown, with an appropriate adjustment of the circuit polarity and biasing, so long as the proper FET drain voltage balance is maintained.

Figure 3:
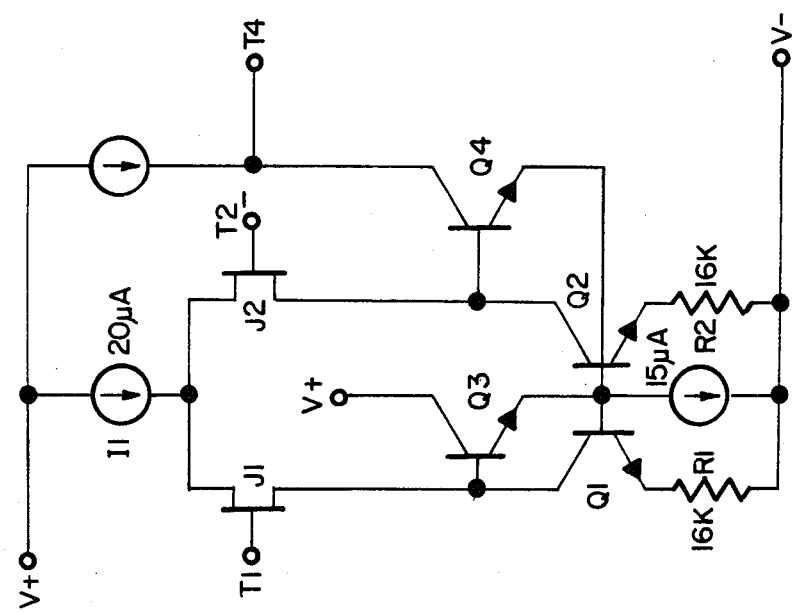
FIG. 3 is a schematic diagram of a different operational amplifier input stage, using a prior art active load.

Referring now to FIG. 3, a modified prior art circuit is shown which addresses a temperature coefficient problem encountered by the prior art circuit of FIG. 1. The problem stems from the fact that integrated circuit current sources and resistors typically have close to zero temperature coefficients, whereas the base-emitter voltage of a transistor may vary considerably with temperature. In FIG. 1, the collector voltage of Q2 relative to the negative voltage bus is equal to the base-emitter voltages of Q4 and Q5, while the base voltage of Q2 relative to the negative bus voltage is equal to the base-emitter voltage of Q2 plus the voltage across R2. The R2 voltage in turn is dependent upon the value of I1, and in the common mode is equal to the resistance of R2 multiplied by one-half of I1. Thus, the collector voltage of Q2 is dependent solely upon transistor base-emitter voltages, while the base voltage of Q2 is dependent in part upon the value of current source I1. If the temperature coefficient of I1 is out of balance with the transistor base-emitter voltage temperature coefficients, the collector voltage of Q2 may drop below the base voltage, in which event Q2 will become saturated and no longer operate properly.

Figure 4:
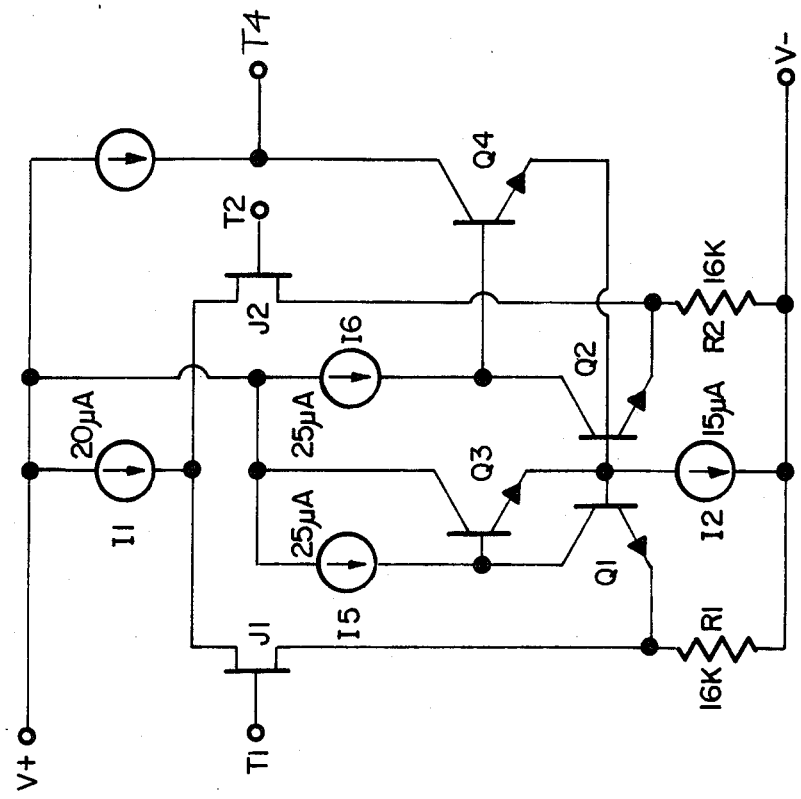
FIG. 4 is a schematic diagram of the operational amplifier input state of FIG. 3, with an active load circuit in accordance with the invention.

To alleviate this problem, the prior art circuit shown in FIG. 3 ties the emitter of Q4 directly to the common base connection of Q1 and Q2, thereby holding the Q2 collector voltage at one base-emitter voltage step above the Q2 base voltage. FIG. 4 illustrates the application of the present invention to the FIG. 3 circuitry. As in the improved circuit of FIG. 2, separate current sources I5 and I6 are provided to maintain the current through Q1 and Q2, thus maintaining the balance between the drain voltages of J1 and J2 by tying the drains to the negative voltage bus directly through R1 and R2, respectively.

While particular embodiments of the invention have been shown and described, numerous modifications and alternate embodiments will occur to those skilled in the art. Accordingly, it is intended that the invention be limited only in terms of the appended claims.

I claim:

1. An active load circuit for a circuit having first and second variable current drives, said current drives varying in opposition to each other in response to differential voltages applied to the drives, comprising:
    first and second resistor means adapted to receive current from the first and second current drives respectively,
    first and second current sources,
    first and second bipolar load transistors connected to transmit current from the first and second current sources to the first and second resistor means, respectively,
    means mutually coupling the bases of the load transistors,
    bias circuit means providing common mode biases for the first and second load transistors to transmit currents from said current sources to said resistors in amounts sufficient to establish substantially equal voltage drops across said resistors, and
    an output terminal connected in circuit with the second current source and the second load transistor to provide an output voltage signal which varies in accordance with the differential voltage applied to the current drives.

2. The active load circuit of claim 1, wherein the bases of the first and second load transistors are maintained by the bias circuit means at a common bias level.

3. The active load circuit of claim 2, wherein said first and second load transistors comprise npn transistors having their emitters respectively connected to the first and second resistor means and their collectors respectively connected to the first and second current sources, and said output terminal is connected to the junction between the second current source and the collector of the second load transistor, the load transistor bias voltage being determined by the current level through the first resistor means and the base-emitter voltage of the first load transistor.

4. The active load circuit of claim 3, said first and second resistor means comprising respective resistors of substantially equal resistance values, and said current sources supplying substantially equal currents.

5. The active load circuit of claim 1, said load transistors having a common base and a common bias circuit.

6. An active load input stage, comprising:
    a first current source means,
    first and second amplifier transistors connected as a differential amplifier to steer current from the current source through the transistors in a ratio determined by the bias voltages applied to each transistor,
    first and second resistor means connected as loads to the first and second transistors, respectively,
    first and second load transistors connected to transmit current to the first and second resistor means, respectively, said load transistors having a common current control connection,
    a common bias circuit for said first and second load transistors,
    a second current source means connected to supply currents to the first and second resistor means through the first and second load transistors, respectively, and
    an output circuit connected to one of the load transistors to supply an output voltage which varies with the differential in the bias voltages applied to the amplifier transistors.

7. The active load input stage of claim 6, said first and second amplifier transistors comprising junction field effect transistors.

8. The active load input stage of claim 7, said second current source means comprising a pair of current sources connected in circuit with the first and second load transistors, respectively.

9. The active load input stage of claim 8, said pair of current sources supplying substantially equal currents, and said first and second resistor means comprising resistors of substantially equal resistance value.

10. An active load input circuit, comprising:
 first and second voltage busses of opposite polarity,
 a first current source connected to be supplied by the first voltage bus,
 first and second junction field effect transistors (JFETs) each having a source, drain and gate, the JFET sources being connected in common to receive current from the first current source, their gates being connected to respective differential amplifier input terminals, and the in drains providing load drive currents,
 first and second load resistors of substantially equal resistance values connected between the drains of the first and second JFETs, respectively, and the second voltage bus,
 second an third substantially equal current sources connected to be supplied by the first voltage bus,
 first and second bipolar load transistors having their collector-emitter circuits connected to conduct current from the second current source to the first resistor, and from the third current source to the second resistor, respectively, said load transistors having a common base connection, and
 means for supplying a common bias signal to the first and second load transistors to render them conductive,
 whereby substantially equal currents are transmitted through the two load resistors during common mode operation, thereby maintaining the drains of the two JFETs at substantially equal voltages.

11. The active load input circuit of claim 10, said first and second load transistors comprising npn transistors having their collectors connected to receive current from the second and third current sources, respectively, and their emitters connected to deliver current to the first and second load resistors, respectively.

12. The active load input circuit of claim 11, further comprising an output circuit connected to the collector of one of the load transistors.

13. The active load circuit of claim 12, said means for supplying a common bias signal to the first and second load transistors comprising a fourth current source connected to draw current from the bases of said transistors, and a third bipolar transistor having its base connected for biasing to the collector of the other one of the first and second load transistors, and its collector-emitter circuit connected to supply current to the bases of the load transistors.

14. The active load input circuit of claim 12, said second and third current sources supplying substantially equal currents.

* * * * *

UNITED STATES PATENT AND TRADEMARK OFFICE
CERTIFICATE OF CORRECTION

PATENT NO. : 4,687,984

DATED : August 18, 1987

INVENTOR(S) : James R. Butler

It is certified that error appears in the above—identified patent and that said Letters Patent is hereby corrected as shown below:

Column 3, lines 42-43: Delete "relative to that through" and insert instead --and--.

Column 3, line 44: Delete "I6" and insert instead --J2--.

Column 3, line 57: Between "in" and "Q2" insert --both Q1 and--.

Column 3, lines 57-58: After "Q2", delete "relative to I6".

Signed and Sealed this

Twelfth Day of January, 1988

Attest:

DONALD J. QUIGG

Attesting Officer

Commissioner of Patents and Trademarks